United States Patent [19]

Matsumoto et al.

[11] Patent Number: 4,798,962
[45] Date of Patent: Jan. 17, 1989

[54] MULTI-WAVELENGTH PROJECTION EXPOSURE AND ALIGNMENT APPARATUS

[75] Inventors: Koichi Matsumoto, Tokyo; Yutaka Suenaga, Kawasaki; Makoto Uehara, Tokyo; Kiyoyuki Muramatsu, Yokohama, all of Japan

[73] Assignee: Nikon Corporation, Tokyo, Japan

[21] Appl. No.: 16,120

[22] Filed: Feb. 18, 1987

[30] Foreign Application Priority Data

Feb. 24, 1986 [JP] Japan .................................. 61-38852

[51] Int. Cl.$^4$ ............................................. G01B 11/00
[52] U.S. Cl. ..................................... 250/548; 356/401
[58] Field of Search ....................... 250/548, 557, 561; 356/399, 400, 401

[56] References Cited

U.S. PATENT DOCUMENTS 4,362,389 12/1982 Koizumi et al. ..................... 356/401
4,614,432 9/1986 Kuniyoshi et al. ................... 250/548
4,682,037 7/1987 Kosugi ................................ 250/548

Primary Examiner—Edward P. Westin
Attorney, Agent, or Firm—Shapiro and Shapiro

[57] ABSTRACT

A projection exposure apparatus has a pattern lighting optical system including an exposure light source for lighting a pattern on a photomask, a projection optical system for forming an image of the pattern lighted by the exposure light source on the surface of a wafer, an alignment lighting optical system including an alignment light source for lighting alignment marks on the photomask and the wafer, and an alignment optical system for detecting relative positional relationship between the mask pattern and the wafer through the projection optical system, and further the projection optical system includes an image-forming system which exhibits two extremums of axial aberration as a function of wavelength.

13 Claims, 4 Drawing Sheets

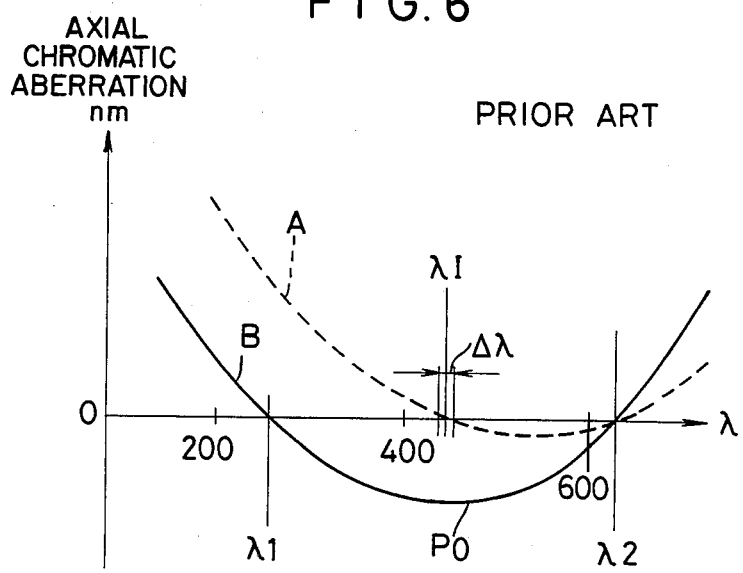

MULTI-WAVELENGTH PROJECTION EXPOSURE AND ALIGNMENT APPARATUS

BACKGROUND OF THE INVENTION

1. Field of the Invention

The present invention relates to an exposure apparatus for conducting a projection exposure of minute circuit patterns of integrated circuits such as ICs and LSIs on the surface of a wafer. More particularly, the invention is concerned with a projection exposure apparatus which makes use of light of different wavelengths for the exposure and for alignment.

2. Related Background Art

Exposure apparatus for projecting and printing minute circuit patterns of integrated circuits such as ICs and LSIs requires a projection optical system having a specifically high level of resolution. To cope with such a demand, it is a common practice to use light of wavelengths of 436 nm or 365 nm in the emission spectrum of a high-voltage mercury lamp. In order to precisely project and print the mask pattern on a wafer, the exposure apparatus employs an alignment optical system for detecting the relative position between the wafer and photomask. In order to enable an easy visual check of the state of alignment between the photomask and the wafer, the light source of the alignment optical system usually employs, for example, a He-Ne laser having wavelength of, for example, 632.8 nm.

It is also a common measure to employ in the alignment optical system a TTL system which makes use of the whole or a part of the projection optical system. In order to observe both the alignment mark on the wafer and the alignment mark on the mask simultaneously by the TTL system, it is necessary that the projection optical system can correct chromatic aberration both for the wavelength of the light used in the exposure and the wavelength of the light used in the alignment.

It is assumed here that light used for the exposure has a short wavelength 80 $_f$ of, for example, 436 nm, while the light used in the alignment has a long wavelength $\lambda_2$ of, for example, 632.8 nm. A characteristic shown by a broken-line curve A in FIG. 6 is obtained as a result of chromatic aberration correction at these two wavelengths. In FIG. 6, the axis of abscissa represents the wavelength, while the axis of ordinate represents the axial chromatic aberration.

The actual light source has a certain band width of wavelength as indicated by $\Delta\lambda$ in FIG. 6. Therefore, even if the chromatic aberration is completely absorbed at the wavelength $\lambda_f$, a large chromatic aberration is caused at wavelengths which corresponds to the band width $\Delta\lambda$ on both sides of the wavelength $\lambda_f$. This large chromatic aberration seriously deteriorates the resolution of the projection optical system. In the two-color correction projection optical system having a characteristic as shown by curve A in FIG. 6, the spectrum of 436 nm from the high-voltage mercury lamp has a wavelength band width of about ±5 nm, so that the desired high level of resolution cannot be obtained unless the chromatic aberration is corrected materially completely over the wavelength band of 10 μ.

To obviate this problem, an exposure apparatus has been proposed in which the exposure light source is capable of restricting the wavelength region into a narrow band, in order to obtain a high resolution even with a projection optical system after chromatic aberration for correction for two wavelengths. In such an exposure apparatus, a projection system with chromatic aberration corrected for two wavelengths as shown by solid-line curve B in FIG. 6 is used, and the exposure is conducted at a first wavelength $\lambda_1$(248.5 nm) while the alignment is effected at a second wavelength $\lambda_2$. In this exposure device, however, only laser beam sources having restricted narrow wavelength bands are usable as the light sources for the exposure and alignment. Thus, this type of exposure apparatus cannot utilize high-voltage mercury lamps or halogen lamps which are commonly used as the exposure light sources. In addition, since the wavelength for the alignment is limited to only one wavelength value, there is a risk that the precision of detection of the alignment signal may be impaired depending on the condition of the photoresist on the wafer.

SUMMARY OF THE INVENTION

Accordingly, an object of the present invention is to provide an exposure apparatus which is capable of effecting a good chromatic aberration correction even for light of a spectral width which requires chromatic aberration, such as the light from conventionally used high-voltage mercury lamp or halogen lamp, thus enabling such conventionally used lamps as the exposure light source, while ensuring a high resolution and an extremely high precision of alignment, thereby overcoming the above-described problems of the prior art.

To this end, according to the invention, there is provided a projection exposure apparatus comprising a pattern lighting optical system including an exposure light source for lighting a pattern on a photomask, a projection optical system for forming an image of the pattern lighted by the exposure light source on the surface of a wafer, an alignment lighting optical system including an alignment light source for lighting alignment marks on the photomask and the wafer, and an alignment optical system for detecting relative positional relationship between the mask pattern and the wafer through the projection optical system, wherein the projection optical system includes an image-forming system which exhibits two extremums of axial aberration as a function of wavelength.

With this arrangement, it is possible to use not only a laser beam source but also other light source for emitting light of a spectral width which requires a chromatic aberration correction.

Thus, the exposure apparatus makes use of a projection system which includes an image-forming system which exhibits two extremums of axial aberration as a function of wavelength. It is, therefore, possible to correct the chromatic aberrations of both the exposure light and alignment light. This in turn makes it possible to employ, as the exposure light source, a conventionally used light source such as a high-voltage mercury lamp or a halogen lamp which emits light of a large spectral width. It is also possible to use, either in the exposure light source device or in the alignment light source device, a plurality of light sources having different wavelengths. Therefore, when a light source of a sufficiently small spectral width such as a laser is used in the exposure light source, it is possible to reduce any standing-wave effects which appear on the side wall surface of the pattern on the wafer, by adoption of a two-wavelength exposure method. On the other hand, the wavelength of the alignment light can be selected freely in accordance with the photoresist to be used.

Thus, the invention provides an exposure device which is capable of performing alignment and exposure with a high degree of precision.

The invention will become more clear from the following description of the preferred embodiments taken in conjunction with the accompanying drawings.

BRIEF DESCRIPTION OF THE DRAWINGS

FIG. 6 is a diagram showing axial chromatic correction characteristic showing the state of chromatic aberration correction in a known exposure device.

DESCRIPTION OF THE PREFERRED EMBODIMENTS

Figure 1:
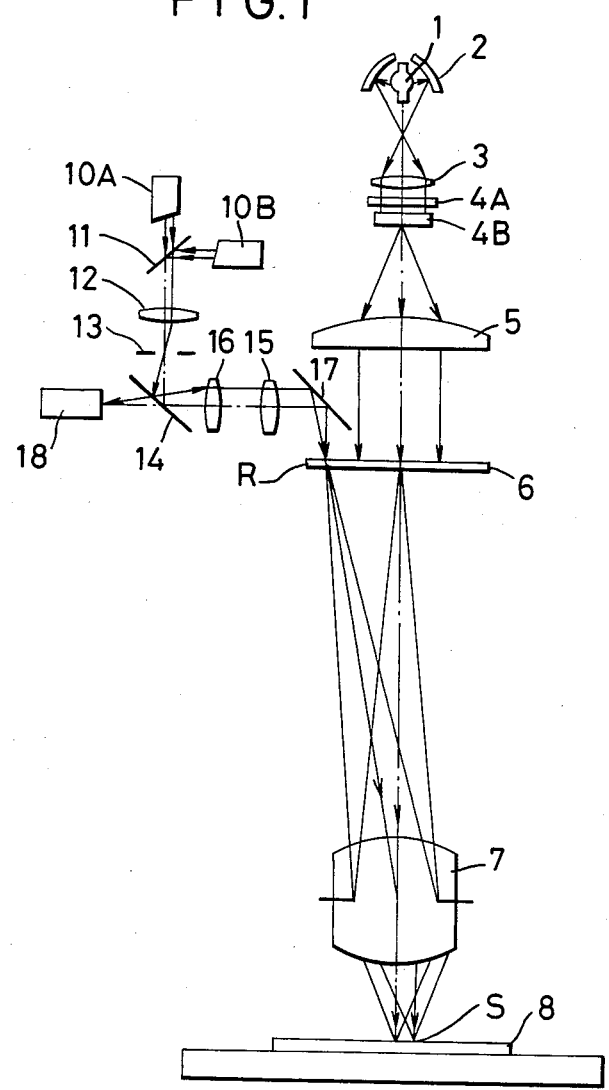
FIG. 1 is a schematic illustration of optical systems incorporated in a first embodiment of a projection exposure apparatus in accordance with the present invention.

Referring to FIG. 1 showing the arrangement of optical systems in a first embodiment of the projection exposure apparatus of the present invention, light emitted from a high-voltage mercury lamp 1 as the exposure light source is collected by an elliptic reflection mirror 2 and is changed into a parallel beam through a collimator lens 3. The parallel beam is applied to a photomask (referred to as "reticle", hereinunder) 6 on an original, through a band-pass filter 4A which limits the exposure wavelength to a predetermined spectral width (wavelength band width), an optical integrator 4B constituted by a fly-eye lens, and a condenser lens 5. The exposure light source 1, elliptic mirror 2, collimator lens 3, band-pass filter 4A, optical integrator 4B and the condenser lens 5 in combination constitute a pattern lighting optical system. The pattern on the reticle 6 lighted through the pattern lighting optical system 1-5 is projected through a projection optical system, which will be detailed later, onto a photoresist (photosensitive layer) on the wafer 8, thereby effecting exposure and printing.

On the other hand, an alignment light source employs a pair of laser sources 10A and 10B which are capable of oscillating light beams of different wavelengths. The light from one 10A of the laser sources is transmitted through a half mirror 11, while the light from the other 10B is reflected by the half mirror 11 and is applied to an alignment mark R on the reticle 6 so as to light the alignment mark R, through a condenser lens 12, a field stop 13, a half mirror 14, a second alignment objective lens 16, a first alignment objective lens 15 and a mirror 17. The light from the laser source 10B is further applied to an alignment mark S on the wafer 8 through the projection optical system 7. The reason why two light beams of different wavelengths are used in the alignment optical system will be explained later.

The image of the alignment mark S on the wafer 8, lighted by the laser beams from both laser sources 10A and 10B, is magnified and projected through the projection optical system so as to form an intermediate image. This intermediate image is superposed on the alignment mark R on the reticle 6. The images of the superposed alignment marks R and S are projected on the light-receiving surface of an ITV image pickup tube 18 disposed behind 5 the half mirror 14 through the first alignment objective lens 15 and the second alignment objective lens 16. In consequence, the positional offset of the alignment mark S on the wafer 8 with respect to the alignment mark R on the reticle 6 is detected through the ITV image pickup tube 18, thus enabling the operator to visually confirm the state of alignment with a high degree of precision. It is possible to use a movable mirror which can be inserted into and withdrawn from the optical path, in place of the half mirror 11, so as to switch the light from the light emitted by the laser source 10A to the light emitted by the laser source 10B. When it is not necessary to use two alignment light beams, it is of course possible to neglect one 10B of the laser sources and the half mirror 11.

Figure 2:
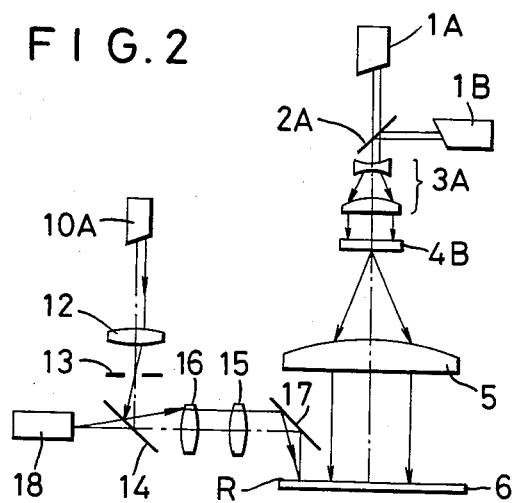
FIG. 2 is a schematic illustration of optical systems incorporated in a second embodiment of the projection exposure apparatus in accordance with the present invention.

FIG. 2 shows a second embodiment of the present invention in which laser sources 1A and 1B for emitting light beams of different wavelengths are used as the exposure light source. The laser beams from both laser sources 1A and 1B are introduced to a beam expander 3A through a half mirror 2A, and are applied to the reticle 6 so as to illuminate the latter, through an optical integrator 4B and a condenser lens 5. The reason why two laser sources 1A and 1B are used will be detailed later. In this embodiment, a single laser source 10A is used as the alignment light source. Other portions of the second embodiment are materially the same as those of the first embodiment shown in FIG. 1. Therefore, the same reference numerals are used in FIG. 2 to denote the same parts or elements as those appearing in FIG. 1 and detailed description of such parts or elements is omitted. The projection optical system 7, wafer 8 and the light beam from the reticle 6 to the wafer 8 also are neglected from FIG. 2.

A description will be given hereinunder as to chromatic aberration correction in the projection system 7 which is intended for both the projection of the pattern of the reticle 6 and the formation of the image of the alignment mark S onto the surface of the reticle 6.

In order to improve the resolution of the projection optical system 7 for projecting the image of the pattern of the reticle 6 onto the wafer 8, it is necessary to increase the aperture number NA of the projection optical system, while reducing the wavelength of the light used in the projection.

In general, the following relationship exists between the aperture number NA, wavelength $\lambda$ and the focal depth d which determines the allowable range of the chromatic aberration on the axis.

$$d = \lambda/(2NA^2)$$

In the aligning operation in which the relative positional offset between the alignment mark R on the reticle 6 and the alignment mark S on the wafer 8 is detected, the allowable value of the focal depth can be considerably large because in this case the requirement for the resolution is not so severe provided that a suitable signal detection method is used.

In contrast, the exposure operation for projecting a pattern of the reticle 6 onto the wafer 8 requires a very small focal depth because the wavelength of the light used in the exposure is so short.

In general, the behaviour of the chromatic aberration on the optical axis, related to the focal depth, has only one extremum $P_0$ as represented by the aberration correction curve (see FIG. 6) drawn for the projection optical system of the known apparatus. Therefore, if the correction of axial chromatic aberration is conducted at the alignment side in which the allowable value (focal depth) is large, a problem is caused in that only a light source having an extremely narrow wavelength band width $\Delta\lambda$, which corresponds to the allowable value (focal depth) given for the exposure side, can be used as the light source for the exposure.

Figure 3:
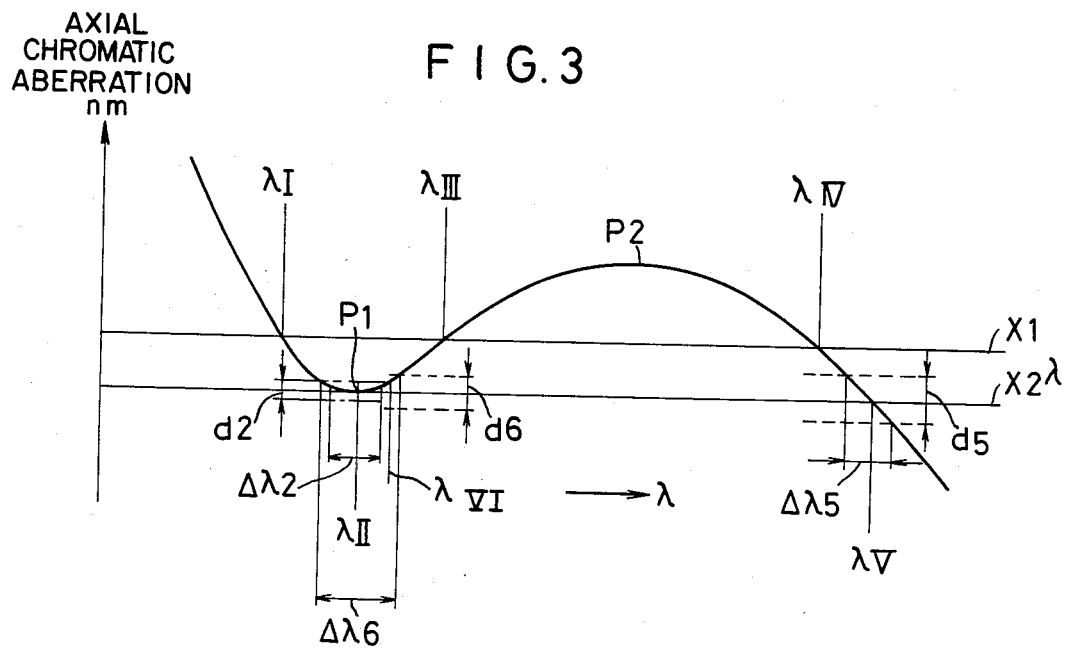
FIG. 3 is a diagram showing axial chromatic correction characteristic used for the purpose of explaining the principle of chromatic aberration correction in a projection optical system which constitutes as essential portion of the apparatus in accordance with the present invention.

However, if the chromatic aberration correction is effected with an optical material exhibiting an extraordinary diffusion, e.g., a fluorite or lithium fluoride, used as the material of the glass constituting the projection system 7, it is possible to obtain, as a function of the wavelength, such a behaviour of axial chromatic aberration as having two extremums $P_1$ and $P_2$ as shown in FIG. 3. In FIG. 3, the axis of ordinate also represents the axial chromatic aberration.

The axial chromatic aberration curve shown in FIG. 3 shows that the chromatic aberration on the optical axis can be reduced to zero at the level of the axis $X_1$ of abscissa at three points $\lambda_I$, $\lambda_{III}$ and $\lambda_{IV}$ of wavelength. The shortest wave length $\lambda_I$ is used for exposure, while the longest wavelength $\lambda_{IV}$ is used for alignment. The intermediate wavelength $\lambda_{III}$ can be used both for the exposure and alignment. On the other hand, at the level of the axis $X_2$ of abscissa which contacts the extremum $P_1$ of the shorter wavelength, the axial chromatic aberration can be reduced to zero at the point of wavelength $\lambda_{II}$ (wavelength at the extremum $P_1$) and at a wavelength $\lambda_V$ which is longer than the wavelength corresponding to the extremum $P_2$ of longer wavelength. Therefore, in the region near the extremum $P_1$, a large spectral width (wavelength band width) $\Delta\lambda_2$ is obtained for the focal depth (allowable range of axial chromatic aberration) $d_2$ even when the depth $d_2$ is small. For these reasons, it is possible to use, as the exposure light source, a light source other than the laser source, having a wide spectral width such as a conventionally used high-voltage mercury lamp (see FIG. 1). In this case, for a long wavelength $\lambda_V$ exceeding the wavelength of the extremum $P_2$ of the longer wavelength, it is possible to effect an alignment with chromatic aberration correction by the laser source.

In this aligning operation, it is possible to adopt a considerably large value for the focal depth $d_5$ by suitably selecting the signal detection method. In consequence, the usable wavelength region $\Delta\lambda_5$ corresponding to the focal depth $d_5$ is widened. It is thus possible to use a suitable laser source which emits a laser beam of a wavelength ranging within the wavelength region $\Delta\lambda_5$, e.g., the laser source 10A shown in FIG. 1.

The focal depth $d_6$ for the alignment light can be selected to be greater than the focal depth allowed for the exposure, e.g., $d_2$ in FIG. 3, even when the alignment is effected with light of a wavelength, e.g., $\lambda_{VI}$ shown in FIG. 3, near the wavelength of the extremum $P_1$ of shorter wavelength. It is, therefore, possible to widen the wavelength region, e.g., $\Delta\lambda_6$ in FIG. 3, in which the wavelength of the alignment laser source, e.g., laser source 10B in FIG. 1, is selected. Thus, the wavelength of the laser source can be selected from a wider region $\Delta\lambda_6$ of the wavelength.

Figure 4:
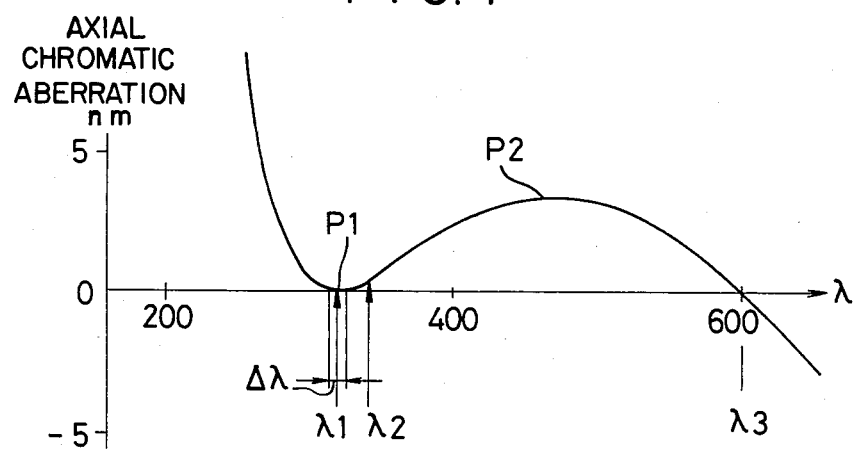
FIG. 4 is a diagram showing axial chromatic correction characteristic showing the state of chromatic aberration correction of a projection optical system incorporated in the first embodiment.
Figure 5:
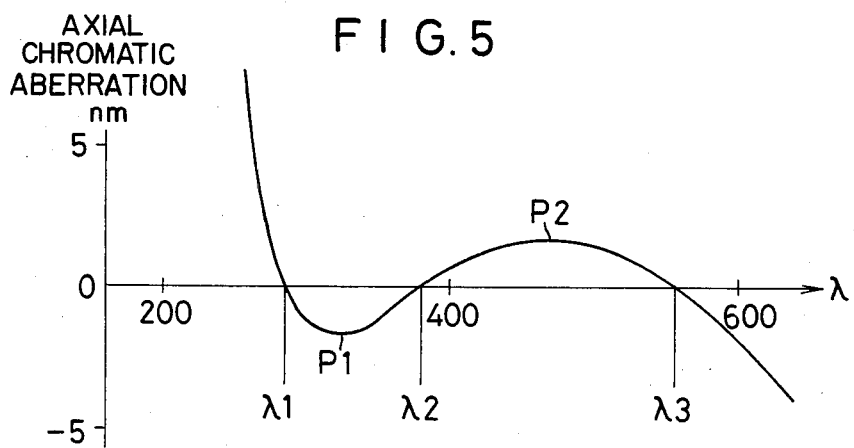
FIG. 5 is a diagram showing axial chromatic correction characteristic showing the stage of chromatic aberration correction of a projection optical system incorporated in the second embodiment.

In FIGS. 4 and 5 which will be mentioned hereinunder, the axis of ordinate represents the axial chromatic aberration.

More specifically, FIG. 4 shows a curve representing the state of chromatic aberration correction in an example of the projection optical system 7 shown in FIG. 1. In this case, the chromatic aberration correction is effected at the wavelength $\lambda_1$ corresponding to one $P_1$ of the extremums and at another wavelength $\lambda_3$ so that the projection optical system 7 is used as a projection exposure apparatus which makes use of light of wavelengths $\lambda_1$ and $\lambda_3$ as the exposure light and the alignment light, respectively. In this case, the wavelength $\lambda_1$ corresponds to the peak value $P_1$ so that only a slight axial chromatic aberration is caused even when the exposure light source has a certain spectral width $\Delta\lambda$. It is, therefore, possible to use a light source other than the laser source as the source 1 of the exposure light. More specifically, lights having wavelengths centered at g-line (436 nm) and i-line (365 nm) in the spectrum of mercury are successfully used. For the wavelength $\lambda_3$, the laser for the alignment can be used conveniently. More practically, a He-Ne laser (633 nm) or He-Cd laser (442 nm) are suitably used for this purpose.

According to the invention, it is possible to set another alignment light of wavelength $\lambda_2$ within a region near the wavelength $\lambda_1$ where the axial chromatic aberration falls within an allowable range. If only one alignment light is available, the precision of detection of the alignment signal may be impaired due to reflectivity and absorption of the photoresist on the wafer 8 at the wavelength of this alignment light. This problem, however, can be overcome by setting alignment lights of two wavelengths $\lambda_2$ and $\lambda_3$ or more light for the aligning purpose.

When the axial chromatic aberration is corrected such that the aberration is reduced to zero at three wavelength points $\lambda_1$, $\lambda_2$ and $\lambda_3$ as shown in FIG. 5, it is possible to use the wavelengths $\lambda_1$ and $\lambda_2$ for the exposure purpose, while using the wavelength $\lambda_3$ for the purpose of attaining the alignment. The light of wavelengths $\lambda_1$ and $\lambda_2$, however, cannot have sufficiently large spectral width because these wavelengths are comparatively short. It is, therefore, preferred to use a laser source for the aligning purpose. More practically, KrF excimer laser (249 nm) and XeCl excimer laser (308 nm) are suitably used. It is also preferred that these lasers are used in injection locking mode. In this case, as shown in FIG. 2, two excimer lasers 1A and 1B are used and the pattern images are projected simultaneously with the light from these laser sources through a half mirror 2A or, alternatively, switching between both light sources is conducted by a movable mirror used in place of the half mirror 2A and adapted to be inserted into and withdrawn from the optical axis. By conducting the exposure at a plurality of wavelengths, it is possible to reduce the formation of wrinkled structure on the side wall of the wafer pattern due to standing waves, thus smoothing the side wall surface of the wafer pattern. This in turn makes it possible to form a finer pattern on the wafer 8.

As an alternative way, it is possible to use only the wavelength 1 for the exposure, while using the wavelengths $\lambda_2$ and $\lambda_3$ for the aligning purpose. In such a case, the laser source 1B and the half mirror 2A shown in FIG. 1 are dispensed with, and a laser beam 10B and a half mirror 11 as shown in FIG. 1 are added to the optical system for alignment. By using these two different wavelengths for the aligning purpose, it becomes possible to obtain a high precision of alignment for a variety of materials of photoresist on the wafer 8, as explained before in connection with FIG. 4.

What is claimed is:

1. A projection exposure apparatus for holding a wafer, which has a first alignment mark, and for holding a reticle, which is formed by a light transferring portion and a light shielding portion and has a second alignment mark and a pattern, comprising:

illuminating means provided with an illuminating optical system for illuminating said reticle through said illuminating optical system by first light of a first wavelength and second light of a second wavelength;

a projection optical system disposed between said reticle and said wafer; and alignment means provided with an alignment optical system and alignment detecting means for illuminating said second alignment mark of said reticle by third light of a third wavelength through said alignment optical system and for detecting the relative positional relationship between said wafer and said reticle, said alignment detecting means detecting an image of said second alignment mark through said alignment optical system and detecting an image of said first alignment mark through said projection optical system and said alignment optical system, said third wavelength being longer than said first wavelength and said second wavelength;

said projection optical system having at least two extremums of axial chromatic aberration as a function of wavelength of light, each value of axial chromatic aberration corresponding to said first, second and third wavelengths being substantially zero, the wavelength corresponding to one of said at least two extremum of axial chromatic aberration lying between said first and second wavelengths.

2. A projection exposure apparatus according to claim 1, wherein said projection optical system has only two extremums of axial chromatic aberration as a function of wavelength of light, wherein said first wavelength is shorter than wavelengths corresponding to said two extremums, said second wavelength is longer than the shorter one of two wavelengths corresponding to said two extremums and shorter than the longer one of two wavelengths corresponding to said two extremums, and said third wavelength is longer than wavelengths corresponding to said two extremums.

3. A projection exposure apparatus according to claim 2, wherein the value of axial chromatic aberration of said projection optical system increases for wavelengths corresponding to said two extremums.

4. A projection exposure apparatus for holding a wafer, which has a first alignment mark, and for holding a reticle, which is formed by a light transferring portion and a light shielding portion and has a second alignment mark and a pattern, comprising:

illuminating means provided with an illuminating optical system for illuminating said reticle by first light having a first wavelength through said illuminating optical system;

a projection optical system disposed between said reticle and said wafer; and alignment means provided with an alignment optical system and alignment detecting means for illuminating said second alignment mark of said reticle by second light of a second wavelength through said alignment optical system and for detecting the relative positional relationship between said reticle and said wafer, said alignment detecting means detecting an image of said second alignment mark through said alignment optical system and detecting an image of said first alignment mark through said projection optical system and said alignment optical system, said second wavelength being longer than said first wavelength;

said projection optical system having two extremums of axial chromatic aberration as a function of wavelength of light, said first wavelength being substantially equal to the shorter one of two wavelengths corresponding to said two extremums, the value of axial chromatic aberration of the extremum corresponding to the shorter one of two wavelengths corresponding to said two extremums being substantially equal to zero, the value of axial chromatic aberration of said projection optical system corresponding to said second wavelength being substantially equal to zero.

5. A projection exposure apparatus according to claim 4, wherein said illuminating means has a mercury lamp for generating said first light.

6. A projection exposure apparatus according to claim 4, wherein said second wavelength is longer than the longer one of wavelengths corresponding to said two extremums.

7. A projection exposure apparatus according to claim 6, wherein said alignment means has means for generating light of a third wavelength which is longer than said first wavelength and is shorter than the longer one of wavelengths corresponding to said two extremums.

8. A projection exposure apparatus according to claim 7, wherein the value of axial chromatic aberration corresponding to said second wavelength is in a range of a focal depth of said projection optical system corresponding to said alignment means.

9. A projection exposure apparatus according to claim 8, wherein the value of axial chromatic aberration of said projection optical system increases for wavelengths longer than the longer one of two wavelengths corresponding to said two extremums.

10. A projection exposure apparatus according to claim 9, wherein said illuminating means has a mercury lamp for generating said first light.

11. A projection exposure apparatus for holding a wafer, which has a first alignment mark, and for holding a reticle, which is formed by a light transferring portion and a light shielding portion and has a second alignment mark and a pattern, comprising:

illuminating means providing with an illuminating optical system for illuminating said reticle by first light of a first wavelength through said illuminating optical system;

a projection optical system disposed between said reticle and said wafer; and alignment means provided with an alignment optical system and alignment detecting means for illuminating said second alignment mark of said reticle through said alignment optical system by second light of a second wavelength and third light of a third wavelength and for detecting the relative positional relationship between said wafer and said reticle, said alignment detecting means detecting an image of said second alignment mark through said alignment optical system and detecting an image of said first alignment mark through said projection optical system and said alignment optical system, said first wavelength being longer than said second wavelength and said third wavelength;

said projection optical system having at least two extremums of axial chromatic aberration as a function of wavelength of light, each value of axial chromatic aberration corresponding to said first, second and third wavelengths being substantially zero, the wavelength corresponding to one of said at least two extremums of axial chromatic aberration lying between said first and second wavelengths.

12. A projection exposure apparatus according to claim 11, wherein said first wavelength is shorter than wavelengths corresponding to said two extremums, said second wavelengths is longer than the shorter one of two wavelengths corresponding to said two extremums and shorter than the longer one of two wavelengths corresponding to said two extremums, and said third wavelength is longer than wavelengths corresponding to said two extremums.

13. A projection exposure apparatus according to claim 12, wherein the value of axial chromatic aberration of said projection optical system increases with respect to wavelengths longer than the longer one of two wavelengths corresponding to said two extremums.

* * * * *